US012777891B2

(12) United States Patent
Endo et al.

(10) Patent No.: US 12,777,891 B2
(45) Date of Patent: Oct. 27, 2026

(54) SUBSTRATE-PROCESSING APPARATUS

(71) Applicant: Tokyo Electron Limited, Tokyo (JP)

(72) Inventors: Riichiro Endo, Miyagi (JP); Takehiro Tanikawa, Miyagi (JP); Kazuma Kita, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 189 days.

(21) Appl. No.: 18/754,701

(22) Filed: Jun. 26, 2024

(65) Prior Publication Data

US 2025/0006541 A1 Jan. 2, 2025

(30) Foreign Application Priority Data

Jun. 27, 2023 (JP) ................................. 2023-104896

(51) Int. Cl.
*H10P 72/72* (2026.01)
*H01J 37/32* (2006.01)
*H10P 72/00* (2026.01)

(52) U.S. Cl.
CPC ........ *H10P 72/722* (2026.01); *H01J 37/3244* (2013.01); *H01J 37/32724* (2013.01); *H10P 72/0431* (2026.01); *H10P 72/0602* (2026.01)

(58) Field of Classification Search
CPC ..................................................... H10P 72/722
See application file for complete search history.

(56) References Cited

U.S. PATENT DOCUMENTS 5,522,131 A * 6/1996 Steger ...................... H10P 72/72 29/829
6,215,641 B1 * 4/2001 Busse ................... H10P 72/722 361/234
6,907,924 B2 * 6/2005 Moslehi ................ C23C 16/463 118/724
2006/0002053 A1 * 1/2006 Brown .................... H10P 72/72 361/234
2008/0037194 A1 * 2/2008 Kamitani ................ H10P 72/72 361/234
2021/0005494 A1 * 1/2021 Matyushkin ...... H01J 37/32724

FOREIGN PATENT DOCUMENTS

JP 2021-176186 11/2021

* cited by examiner

*Primary Examiner* — Scott Bauer
(74) *Attorney, Agent, or Firm* — IPUSA, PLLC

(57) ABSTRACT

A substrate-processing apparatus includes a substrate support that includes an electrostatic chuck, the electrostatic chuck including a support surface configured to support an annular member. The support surface includes a diffusion groove through which a heat transfer gas is diffused into a gap between the annular member and the support surface. The diffusion groove includes an annular groove provided concentrically with the electrostatic chuck; and a radial groove that is in communication with the annular groove and is provided from the annular groove in a radial direction of the electrostatic chuck.

7 Claims, 13 Drawing Sheets

SUBSTRATE-PROCESSING APPARATUS

CROSS-REFERENCE TO RELATED APPLICATIONS

This application is based upon and claims priority to Japanese Patent Application No. 2023-104896, filed on Jun. 27, 2023, the entire contents of which are incorporated herein by reference.

BACKGROUND

1. Field of the Invention

The present disclosure relates to substrate-processing apparatuses.

2. Description of the Related Art

Japanese Patent Application Publication No. 2021-176186 discloses a stage assembly on which a substrate is to be disposed. The disclosed stage assembly includes a base; an electrostatic chuck disposed on the base; and an edge ring disposed around the substrate. The edge ring is formed of multiple edge ring pieces divided in a circumferential direction. The electrostatic chuck includes a substrate-attracting section configured to attract the substrate; and an edge ring-attracting section configured to attract the multiple edge ring pieces. The edge ring-attracting section includes heat transfer gas grooves into which a heat transfer gas is supplied. The heat transfer gas grooves are formed in regions in which the multiple edge ring pieces are attracted.

SUMMARY

One aspect of the present disclosure provides a substrate-processing apparatus including a substrate support that includes an electrostatic chuck, the electrostatic chuck including a support surface configured to support an annular member. The support surface includes a diffusion groove through which a heat transfer gas is diffused into a gap between the annular member and the support surface. The diffusion groove includes an annular groove provided concentrically with the electrostatic chuck; and a radial groove that is in communication with the annular groove and is provided from the annular groove in a radial direction of the electrostatic chuck.

DETAILED DESCRIPTION OF THE INVENTION

Figure 1:
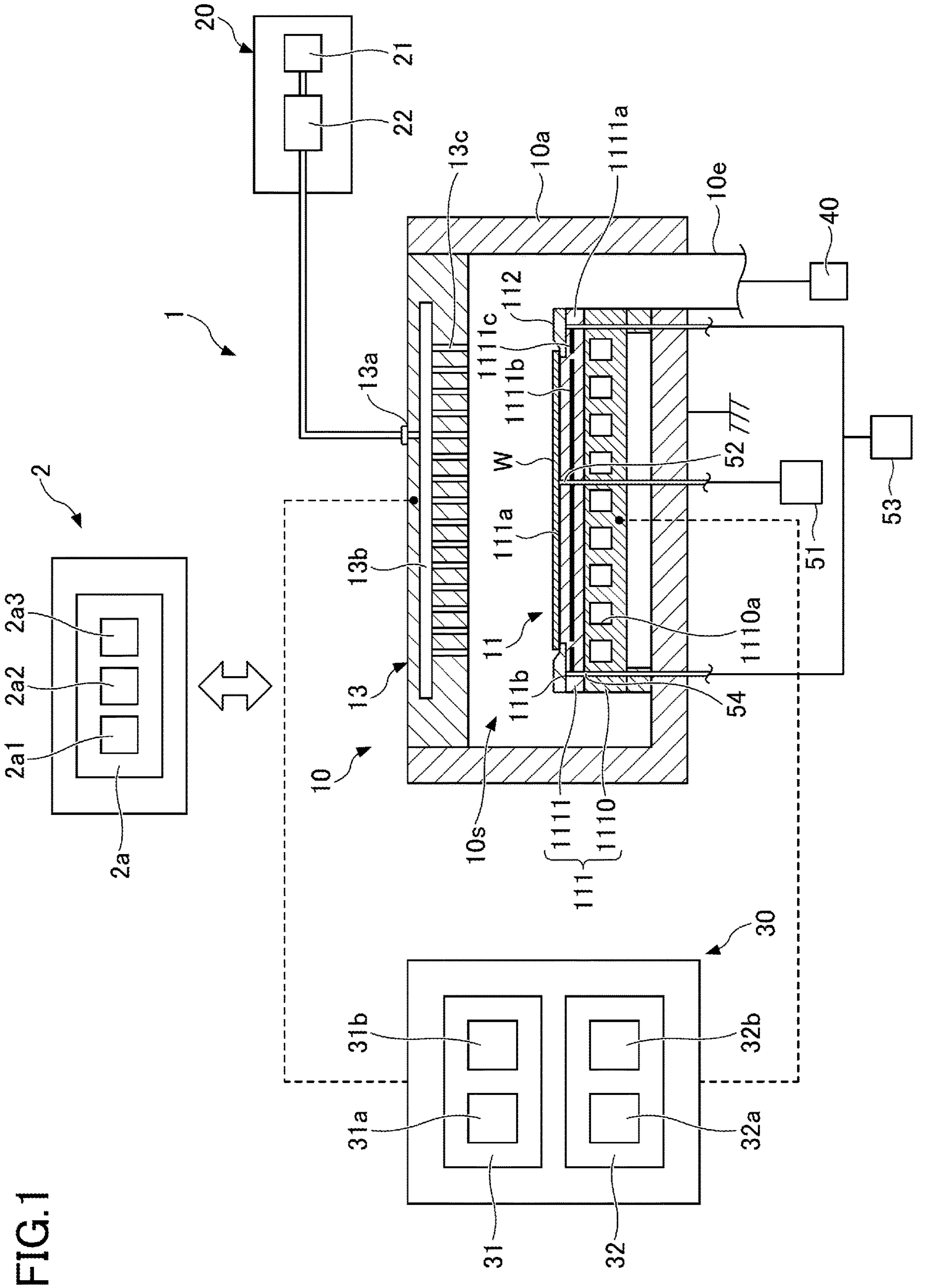
FIG. 1 is an example of a view describing a configuration example of a capacitively coupled plasma processing apparatus.

In one aspect, the present disclosure provides a substrate-processing apparatus configured to improve in-plane uniformity of an attracting force to electrostatically attract an annular member.

Hereinafter, embodiments of the present disclosure will be described with reference to the drawings. In the drawings, the same component may be denoted by the same symbol, and duplicate description thereof may be omitted.

[Plasma Processing System]

A configuration example of the plasma processing system will be described below. FIG. 1 is an example of a view describing a configuration example of a capacitively coupled plasma processing apparatus (substrate-processing apparatus) 1.

The plasma processing system includes the capacitively coupled plasma processing apparatus 1 and a controller 2. The capacitively coupled plasma processing apparatus 1 includes a plasma process chamber 10, a gas supply 20, a power supply 30, and a gas exhaust system 40. Also, the plasma processing apparatus 1 includes a substrate support 11 and a gas introducer. The gas introducer is configured to introduce at least one process gas into the plasma process chamber 10. The gas introducer includes a shower head 13. The substrate support 11 is disposed in the plasma process chamber 10. The shower head 13 is disposed above the substrate support 11. In one embodiment, the shower head 13 forms at least a part of a ceiling of the plasma process chamber 10. The plasma process chamber 10 includes a plasma process space 10*s* defined by the shower head 13, a side wall 10*a* of the plasma process chamber 10, and the substrate support 11. The plasma process chamber 10 includes at least one gas supply port through which at least one process gas is supplied to the plasma process space 10*s*; and at least one gas exhaust port through which the gas is exhausted from the plasma process space 10*s*. The plasma process chamber 10 is grounded. The shower head 13 and the substrate support 11 are electrically insulated from a casing of the plasma process chamber 10.

The substrate support 11 includes a body 111 and a ring assembly 112. The body 111 includes a center region 111*a* on which a substrate W is supported; and an annular region 111*b* on which the ring assembly 112 is supported. A wafer is an example of the substrate W. The annular region 111*b* of the body 111 encloses the center region 111*a* of the body 111 in a plan view. The substrate W is disposed on the center region 111*a* of the body 111, and the ring assembly 112 is disposed on the annular region 111*b* of the body 111 so as to enclose the substrate W on the center region 111*a* of the body 111. Accordingly, the center region 111*a* is also referred to as a substrate support surface configured to support the substrate W, and the annular region 111*b* is also referred to as a ring support surface configured to support the ring assembly 112.

In one embodiment, the body 111 includes a base 1110 and an electrostatic chuck 1111. The base 1110 includes a conductive member. The conductive member of the base 1110 can function as a lower electrode. The electrostatic chuck 1111 is disposed on the base 1110. The electrostatic chuck 1111 includes a ceramic member 1111*a*, an electrostatic electrode 1111*b* disposed in the ceramic member 1111*a*, and an annular electrostatic electrode 1111*c* disposed in the ceramic member 1111*a*. The ceramic member 1111*a* includes the center region 111*a*. In one embodiment, the ceramic member 1111*a* also includes the annular region 111*b*. The electrostatic electrode 1111*b* is provided in the center region 111*a* on which the substrate W is supported. The annular electrostatic electrode 1111*c* is provided in the annular region 111*b* on which the ring assembly 112 is supported. Note that other members enclosing the electrostatic chuck 1111, such as an annular electrostatic chuck, an annular insulating member, and the like, may include the annular region 111*b*. In this case, the ring assembly 112 may be disposed on either the annular electrostatic chuck or the annular insulating member, or may be disposed on both of the annular electrostatic chuck and the annular insulating member. Also, at least one RF (Radio Frequency)/DC (Direct Current) electrode connected to an RF power supply 31, a DC power supply 32, or both, which will be described below, may be disposed in the ceramic member 1111*a*. In this case, at least one RF/DC electrode functions as a lower electrode. When a bias RF signal, a bias DC signal, or both, which will be described below, is supplied to at least one RF/DC electrode, the RF/DC electrode is also referred to as a bias electrode. The conductive member of the base 1110 and at least one RF/DC electrode may function as multiple lower electrodes. Also, the electrostatic electrode 1111*b* may function as a lower electrode. Accordingly, the substrate support 11 includes at least one lower electrode.

The ring assembly 112 includes one or more annular members. In one embodiment, the one or more annular members include one or more edge rings, including an edge ring 112A (see FIG. 4 below), and at least one cover ring. The edge ring is formed of a conductive material or an insulating material, and the cover ring is formed of an insulating material.

The substrate support 11 may include a temperature control module configured to adjust the temperature of the electrostatic chuck 1111, the ring assembly 112, the substrate W, or any combination thereof, to the target temperature. The temperature control module may include a heater, a heat transfer medium, a flow path 1110*a*, or any combination thereof. A heat transfer fluid, such as brine or gas, flows through the flow path 1110*a*. In one embodiment, the flow path 1110*a* is formed in the base 1110, and one or more heaters are disposed in the ceramic member 1111*a* of the electrostatic chuck 1111. Also, the substrate support 11 may include a heat transfer gas supply 51 configured to supply a heat transfer gas to a gap between the rear surface of the substrate W and the center region 111*a*. The heat transfer gas supply 51 supplies the heat transfer gas to the gap between the rear surface of the substrate W and the center region 111*a* through a gas flow path penetrating the base 1110 and a supply hole 52 penetrating the electrostatic chuck 1111. Also, the substrate support 11 may include a heat transfer gas supply 53 configured to supply the heat transfer gas to the gap between the rear surface of the edge ring 112A (see FIG. 4 below) of the ring assembly 112 and the annular region 111*b*. The heat transfer gas supply 53 supplies the heat transfer gas to the gap between the rear surface of the edge ring 112A (see FIG. 4 below) of the ring assembly 112 and the annular region 111*b* (including a diffusion groove 113 as described below with reference to FIG. 3 and the like) through a gas flow path penetrating the base 1110 and a supply hole 54 penetrating the electrostatic chuck 1111.

The shower head 13 is configured to introduce at least one process gas from the gas supply 20 into the plasma process space 10*s*. The shower head 13 includes at least one gas supply port 13*a*, at least one gas diffusion chamber 13*b*, and multiple gas introducing ports 13*c*. The process gas supplied to the gas supply port 13*a* passes through the gas diffusion chamber 13*b* and is introduced into the plasma process space 10*s* from the multiple gas introducing ports 13*c*. Also, the shower head 13 includes at least one upper electrode. In addition to the shower head 13, the gas introducer may include one or more side gas injectors (SGI) attached to one or more openings formed in the side wall 10*a*.

The gas supply 20 may include at least one gas source 21 and at least one flow controller 22. In one embodiment, the gas supply 20 is configured to supply at least one process gas from a corresponding gas source 21 to the shower head 13 via a corresponding flow controller 22. The flow controller 22 may include, for example, a mass flow controller or a pressure-controlled flow controller. In addition, the gas supply 20 may include one or more flow rate modulators configured to pulse or modulate the flow rate of at least one process gas.

The power supply 30 includes an RF power supply 31 that is connected to the plasma process chamber 10 via at least one impedance matching circuit. The RF power supply 31 is configured to supply at least one RF signal (RF power) to at least one lower electrode, at least one upper electrode, or both. Thereby, plasma is formed from at least one process gas supplied to the plasma process space 10*s*. Thus, the RF power supply 31 may function as at least a part of a plasma generator configured to generate plasma from one or more process gases in the plasma process chamber 10. Also, by supplying a bias RF signal to at least one lower electrode, a bias potential is generated in the substrate W, and ionic components in the formed plasma can be drawn into the substrate W.

In one embodiment, the RF power supply 31 includes a first RF generator 31*a* and a second RF generator 31*b*. The first RF generator 31*a* is connected to at least one lower electrode, at least one upper electrode, or both via at least one impedance matching circuit and is configured to generate a source RF signal (source RF power) for generation of plasma. In one embodiment, the source RF signal has a frequency in the range of from 10 MHz through 150 MHz. In one embodiment, the first RF generator 31*a* may be configured to generate multiple source RF signals having different frequencies. The generated one or more source RF signals are supplied to at least one lower electrode, at least one upper electrode, or both.

The second RF generator 31*b* is connected to at least one lower electrode via at least one impedance matching circuit and is configured to generate a bias RF signal (bias RF power). The frequency of the bias RF signal may be the same as or different from the frequency of the source RF signal. In one embodiment, the bias RF signal has a frequency that is lower than the frequency of the source RF signal. In one embodiment, the bias RF signal has a frequency in the range of from 100 kHz through 60 MHz. In one embodiment, the second RF generator 31*b* may be configured to generate multiple bias RF signals having different frequencies. The generated one or more bias RF signals are supplied to at least one lower electrode. Also, in various embodiments, the source RF signal, the bias RF signal, or both may be pulsed.

Also, the power supply 30 may include a DC power supply 32 that is connected to the plasma process chamber 10. The DC power supply 32 includes a first DC generator 32*a* and a second DC generator 32*b*. In one embodiment, the first DC generator 32*a* is connected to at least one lower electrode and is configured to generate a first DC signal. The generated first DC signal (bias signal) is applied to at least one lower electrode. In one embodiment, the second DC generator 32*b* is connected to at least one upper electrode and is configured to generate a second DC signal. The generated second DC signal is applied to at least one upper electrode.

In various embodiments, the first DC signal, the second DC signal, or both may be pulsed. In this case, a sequence of voltage pulses is applied to at least one lower electrode, at least one upper electrode, or both. The voltage pulse may have a pulse waveform that is rectangular, trapezoidal, triangular, or any combination thereof. In one embodiment, a waveform generator configured to generate a sequence of voltage pulses from a DC signal is connected between the first DC generator 32*a* and at least one lower electrode. Accordingly, the first DC generator 32*a* and the waveform generator form a voltage pulse generator. When the second DC generator 32*b* and the waveform generator form a voltage pulse generator, the voltage pulse generator is connected to at least one upper electrode. The voltage pulse may have a positive polarity or a negative polarity. Also, the sequence of voltage pulses may include, within one cycle, one or more voltage pulses having a positive polarity or one or more voltage pulses having a negative polarity. The first and second DC generators 32*a* and 32*b* may be provided in addition to the RF power supply 31, and the first DC generator 32*a* may be provided instead of the second RF generator 31*b*.

The gas exhaust system 40 may be connected, for example, to a gas exhaust port 10*e* provided at the bottom of the plasma process chamber 10. The gas exhaust system 40 may include a pressure control valve and a vacuum pump. The pressure control valve adjusts the pressure in the plasma process space 10*s*. The vacuum pump may include a turbomolecular pump, a dry pump, or both.

The controller 2 is configured to process computer-executable instructions that cause the plasma processing apparatus 1 to perform various steps as described in the present disclosure. The controller 2 may be configured to control the components of the plasma processing apparatus 1 so as to perform the various steps as described herein. In one embodiment, a part of or the entirety of the controller 2 may be included in the plasma processing apparatus 1. The controller 2 may include a processor 2*a*1, a storage 2*a*2, and a communication interface 2*a*3. The controller 2 may be implemented, for example, by a computer 2*a*. The processor 2*al* may be configured to read a program from the storage 2*a*2 and execute the read program, thereby performing various controls. This program may be stored in the storage 2*a*2 in advance or may be obtained via a medium when needed. The obtained program is stored in the storage 2*a*2, read from the storage 2*a*2 by the processor 2*al*, and executed. The medium may be various storage media readable by the computer 2*a*, or may be a communication line connected to the communication interface 2*a*3. The processor 2*al* may be a CPU (Central Processing Unit). The storage 2*a*2 may include a RAM (Random Access Memory), a ROM (Read Only Memory), an HDD (Hard Disk Drive), an SSD (Solid State Drive), or any combination thereof. The communication interface 2*a*3 may communicate with the plasma processing apparatus 1 via a communication line, such as a LAN (Local Area Network).

Next, the annular electrostatic electrode 1111*c* and the diffusion groove 113 provided in the annular region 111*b* will be described with reference to FIGS. 2 to 5.

Figure 2:
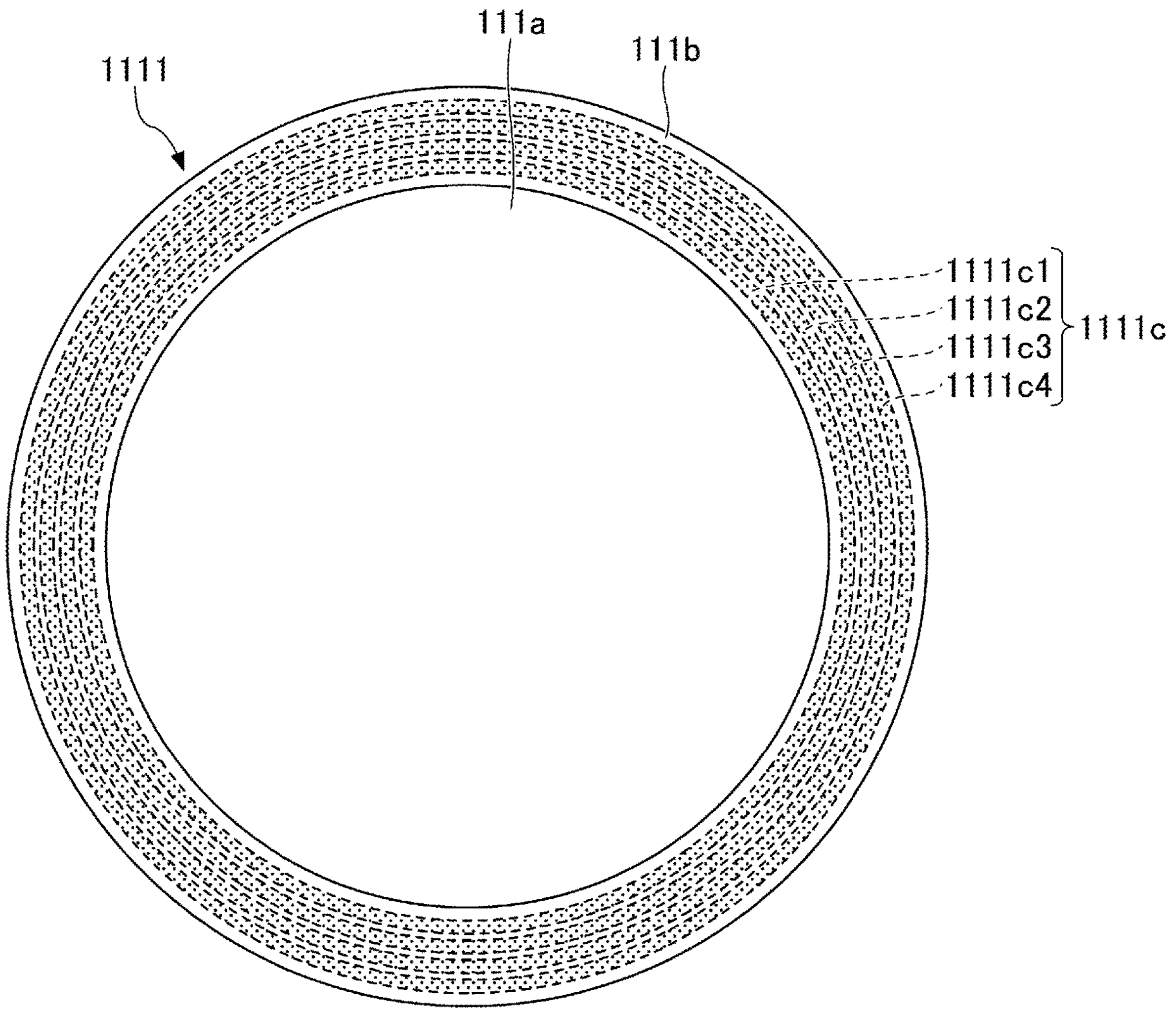
FIG. 2 is an example of a plan view of an electrostatic chuck illustrating arrangement of annular electrostatic electrodes.

FIG. 2 is an example of a plan view of the electrostatic chuck 1111 illustrating arrangement of the annular electrostatic electrode 1111*c*. The plan view as illustrated in FIG. 2 is a view in which the electrostatic chuck 1111 is seen from above. Thus, the annular electrostatic electrode 1111*c* in the ceramic member 1111*a* cannot be directly seen. In FIG. 2, however, the position of the annular electrostatic electrode 1111*c* is shown by means of shading with dashed lines and dots.

The annular electrostatic electrode 1111*c* includes annular electrostatic electrodes 1111*c*1, 1111*c*2, 1111*c*3, and 1111*c*4. The annular electrostatic electrodes 1111*c*1 to 1111*c*4 have an annular shape concentric with the center of the electrostatic chuck 1111 (in other words, the center of the body 111, and in other words, the center of the substrate support 11). The annular electrostatic electrodes 1111*c*1 to 1111*c*4 are disposed in this order from the center of the electrostatic chuck 1111.

The plasma processing apparatus 1 includes unillustrated attracting power supplies. The attracting power supplies are connected to the annular electrostatic electrodes 1111*c*1, 1111*c*2, 1111*c*3, and 1111*c*4. An attracting voltage is applied from the attracting power supplies to the annular electrostatic electrodes 1111*c*1, 1111*c*2, 1111*c*3, and 1111*c*4. The attracting power supply is an alternating current (AC) power supply, and an AC voltage is applied from each of the attracting power supplies to a corresponding one of the annular electrostatic electrodes 1111*c*1, 1111*c*2, 1111*c*3, and 1111*c*4. Thereby, an attracting force is generated between the annular electrostatic electrode 1111*c* and the edge ring 112A. AC voltages having different phases are applied to the annular electrostatic electrodes next to each other among the annular electrostatic electrodes 1111*c*1, 1111*c*2, 1111*c*3, and 1111*c*4. In the following, description will be given of an example in which an AC voltage having the same phase is applied to the annular electrostatic electrode 1111*c*1 and the annular electrostatic electrode 1111*c*3, an AC voltage having a phase different from the phase of the AC voltage applied to the annular electrostatic electrode 1111*c*1 is applied to the annular electrostatic electrode 1111*c*2, and an AC voltage having the same phase is applied to the annular electrostatic electrode 1111*c*2 and the annular electrostatic electrode 1111*c*4.

The voltage applied to the annular electrostatic electrode 1111*c* is not limited to this. The attracting power supply may be a direct current (DC) power supply, and a DC voltage may be applied from each of the attracting power supplies to a corresponding one of the annular electrostatic electrodes 1111*c*1, 1111*c*2, 1111*c*3, and 1111*c*4.

Figure 3:
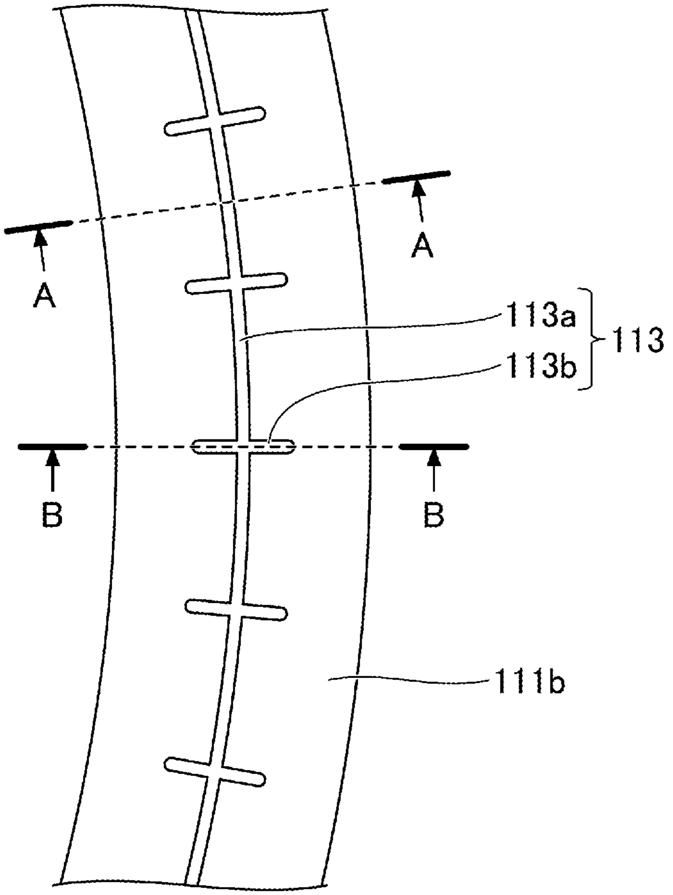
FIG. 3 is an example of a partially enlarged view of an annular region of the electrostatic chuck.
Figure 4:
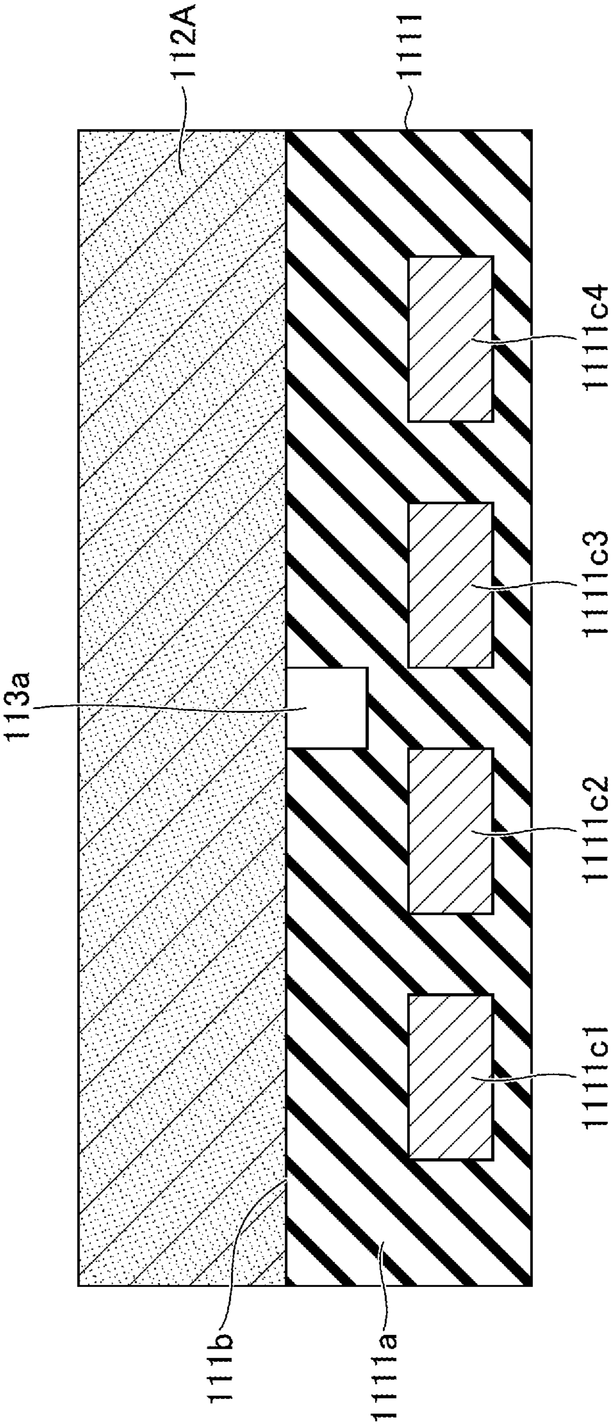
FIG. 4 is an example of a cross-sectional view of the electrostatic chuck and an edge ring that are cut along A-A.
Figure 5:
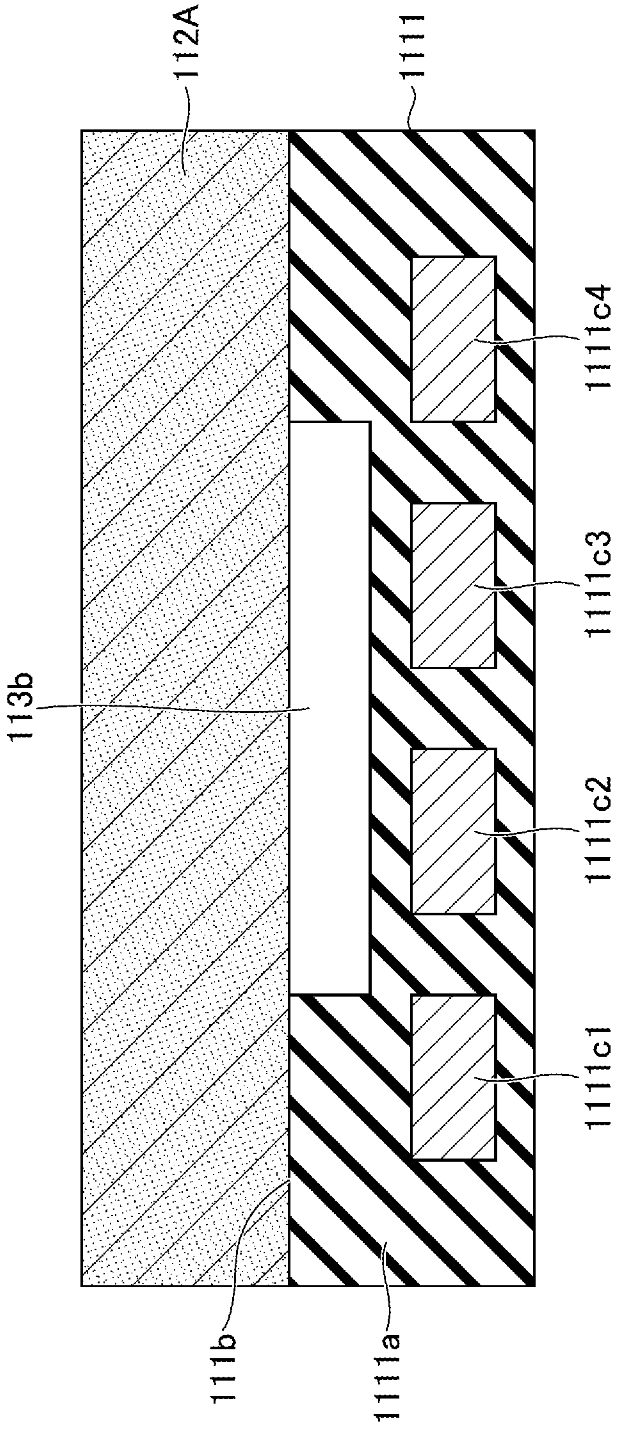
FIG. 5 is an example of a cross-sectional view of the electrostatic chuck and the edge ring that are cut along B-B.

FIG. 3 is an example of a partially enlarged view of the annular region 111*b* of the electrostatic chuck 1111. The partially enlarged view as illustrated FIG. 3 is a view of the electrostatic chuck 1111 as seen from above. FIG. 4 is an example of a cross-sectional view of the electrostatic chuck 1111 and the edge ring 112A that are cut along A-A. FIG. 5 is an example of a cross-sectional view of the electrostatic chuck 1111 and the edge ring 112A that are cut along B-B.

The ring support surface (annular region 111*b*) of the electrostatic chuck 1111 supporting the edge ring 112A is provided with the diffusion groove 113. The diffusion groove 113 diffuses the heat transfer gas into the gap between the edge ring 112A and the ring support surface. The diffusion groove 113 is a groove that diffuses the heat transfer gas (also called a rear surface gas), supplied from the supply hole 54, in the circumferential and radial directions of the ring support surface.

The diffusion groove 113 includes an annular groove 113*a* and multiple radial grooves 113*b*.

The annular groove 113*a* is an annular groove that is provided at the ring support surface (annular region 111*b*) of the electrostatic chuck 1111 and is concentric with the center of the electrostatic chuck 1111. Although not illustrated, the supply hole 54 is in communication with the annular groove 113*a*.

The radial groove 113*b* is a groove that is provided at the ring support surface (annular region 111*b*) of the electrostatic chuck 1111, is in communication with the annular groove 113*a*, and extends from the annular groove 113*a* in the radial direction of the electrostatic chuck 1111. As illustrated in FIG. 3, the radial groove 113*b* is formed as a groove that extends from the annular groove 113*a* outward and inward in the radial direction. That is, one end of the radial groove 113*b* is provided inward of the annular groove 113*a* in the radial direction. The other end of the radial groove 113*b* is provided outward of the annular groove 113*a* in the radial direction.

The radial groove 113*b* is not limited to the groove as illustrated in FIG. 3, and may be formed as a groove that extends outward of, inward of, or both outward and inward of the annular groove 113*a* in the radial direction. Also, the radial groove 113*b* may be formed as a groove that extends from the annular groove 113*a* so as to be closer to the outer or inner circumference of the electrostatic chuck 1111, or so as to be closer to the outer and inner circumferences of the electrostatic chuck 1111.

In this manner, the heat transfer gas supplied from the supply hole 54 is diffused through the annular groove 113*a* in the circumferential direction of the ring support surface. Further, the heat transfer gas is diffused through the radial groove 113*b* in the radial direction of the ring support surface. That is, the heat transfer gas is diffused over the entirety of the ring support surface.

In a plan view of the ring support surface, the annular groove 113*a* is provided at a position not overlapping the annular electrostatic electrode 1111*c* (1111*c*1 to 1111*c*4). In the example as illustrated in FIG. 4, the annular groove 113*a* is provided on the outer circumferential side of the annular electrostatic electrode 1111*c*2 and on the inner circumferential side of the annular electrostatic electrode 1111*c*3. That is, in the radial direction, a side surface of the annular groove 113*a* on the inner circumferential side thereof is provided to coincide with or to be outward of an end surface of the annular electrostatic electrode 1111*c*2 on the outer circumferential side thereof. Also, in the radial direction, a side surface of the annular groove 113*a* on the outer circumferential side thereof is provided to coincide with or to be inward of an end surface of the annular electrostatic electrode 1111*c*3 on the inner circumferential side thereof.

In FIG. 4, the annular groove 113*a* and the annular electrostatic electrode 1111*c* (1111*c*1 to 1111*c*4) are provided at positions not overlapping each other. However, this is by no means a limitation. The annular groove 113*a* and the annular electrostatic electrode 1111*c* (1111*c*1 to 1111*c*4) may partially overlap each other. For example, when an inner circumferential portion of the annular groove 113*a* overlaps the annular electrostatic electrode 1111*c*2, an area where the annular groove 113*a* and the annular electrostatic electrode 1111*c*2 overlap each other is preferably 17% or less the area of the annular electrostatic electrode 1111*c*2. Similarly, when an outer circumferential portion of the annular groove 113*a* overlaps the annular electrostatic electrode 1111*c*3, an area where the annular groove 113*a* and the annular electrostatic electrode 1111*c*3 overlap each other is preferably 36% or less the area of the annular electrostatic electrode 1111*c*3.

In a plan view of the ring support surface, the radial groove 113*b* is provided at a position that partially overlaps the annular electrostatic electrode 1111*c* (1111*c*1 to 1111*c*4). In the example as illustrated in FIG. 5, the radial groove 113*b* is provided so as to overlap the annular electrostatic electrodes 1111*c*2 and 1111*c*3.

Figure 6:
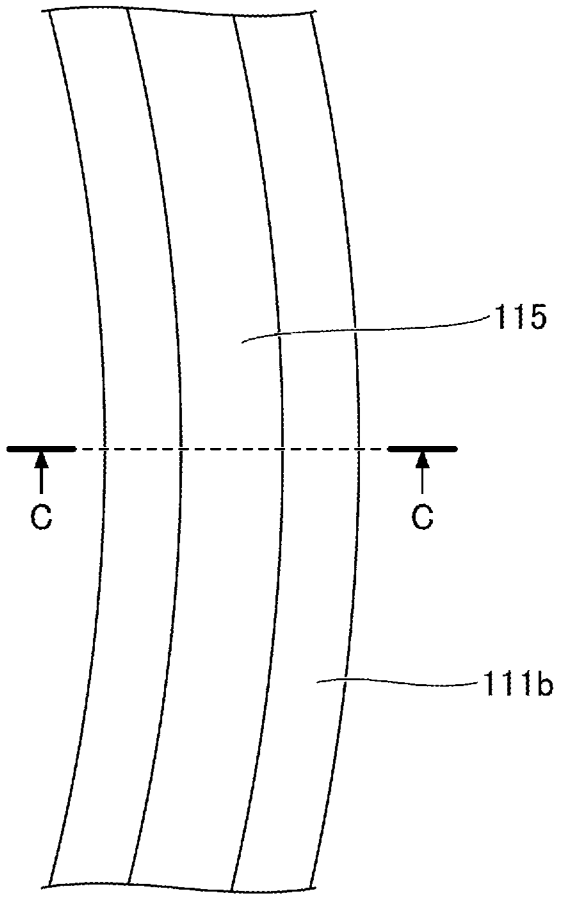
FIG. 6 is an example of a partially enlarged view of an annular region of an electrostatic chuck according to a reference example.
Figure 7:
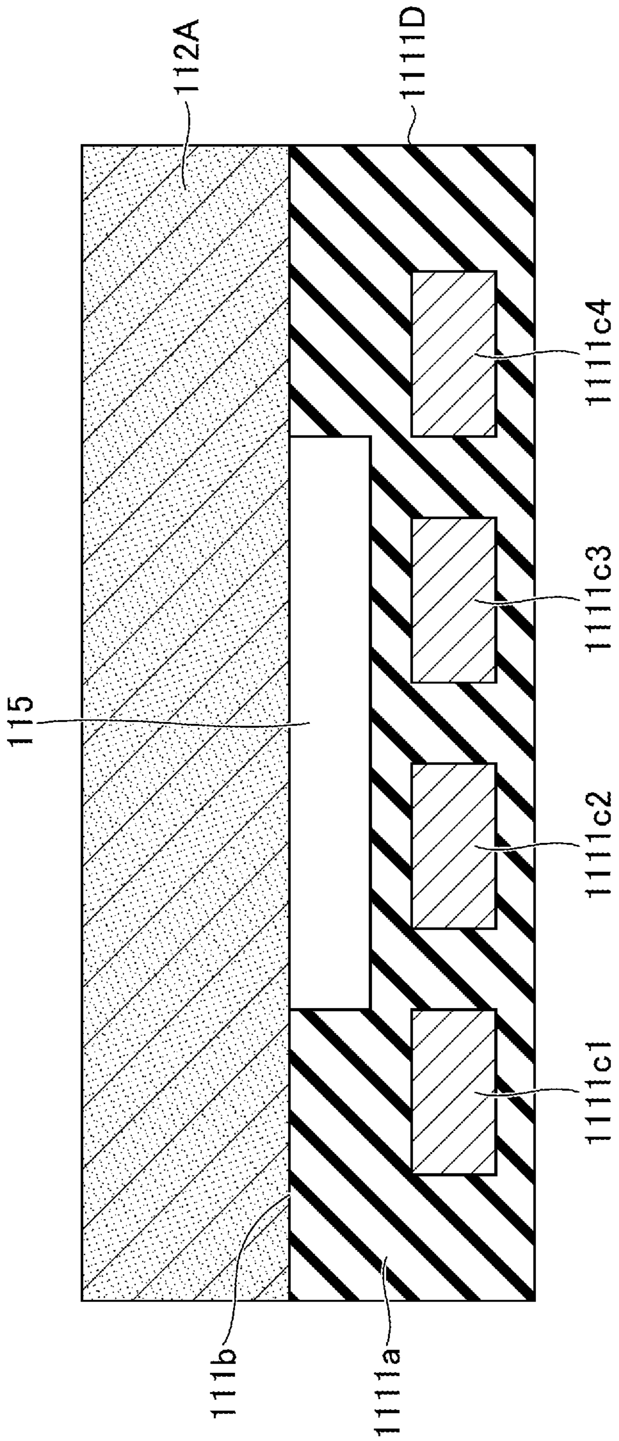
FIG. 7 is an example of a cross-sectional view of the electrostatic chuck according to the reference example and an edge ring that are cut along C-C.

An example of an electrostatic chuck 1111D according to the reference example including a diffusion groove 115 will be described with reference to FIGS. 6 and 7. FIG. 6 is an example of a partially enlarged view of the annular region 111*b* of the electrostatic chuck 1111D according to the reference example. The partially enlarged view as illustrated in FIG. 6 is a view of the electrostatic chuck 1111D according to the reference example as seen from above. FIG. 7 is an example of a cross-sectional view of the electrostatic chuck 1111D and the edge ring 112A according to the reference example that are cut along C-C.

The electrostatic chuck 1111D according to the reference example is different from the electrostatic chuck 1111 (see FIGS. 1 to 5) in terms of the shape of the diffusion groove. Other configurations are the same, and duplicate description thereof will be omitted.

The ring support surface (annular region 111*b*) of the electrostatic chuck 1111D according to the reference example supporting the edge ring 112A is provided with the diffusion groove 115.

The diffusion groove 115 is an annular groove that is provided in the ring support surface (annular region 111*b*) of the electrostatic chuck 1111 and is concentric with the center of the electrostatic chuck 1111. Although not illustrated, the supply hole 54 is in communication with the annular groove 113*a*.

In a plan view of the ring support surface, the diffusion groove 115 is provided at a position that partially overlaps the annular electrostatic electrode 1111*c* (1111*c*1 to 1111*c*4). In the example as illustrated in FIG. 7, the diffusion groove 115 is provided so as to overlap the annular electrostatic electrodes 1111*c*2 and 1111*c*3.

Next, the attracting force to electrostatically attract the edge ring 112A will be described while comparing the electrostatic chuck 1111 including the diffusion groove 113 with the electrostatic chuck 1111D including the diffusion groove 115.

Here, an attracting force F can be expressed by formula (1) below. In this formula, C is a synthesis capacitance, V is a voltage, and d is a distance between polar plates (the distance between the annular electrostatic electrode 1111*c* and the edge ring 112A).

$$F = CV^2/2d \tag{1}$$

As shown in formula (1), even if the voltage V applied to the annular electrostatic electrode 1111*c* (1111*c*1 to 1111*c*4) is constant and the distance d between polar plates is constant, the attracting force F is different when the synthesis capacitance C is different.

Figure 8A:
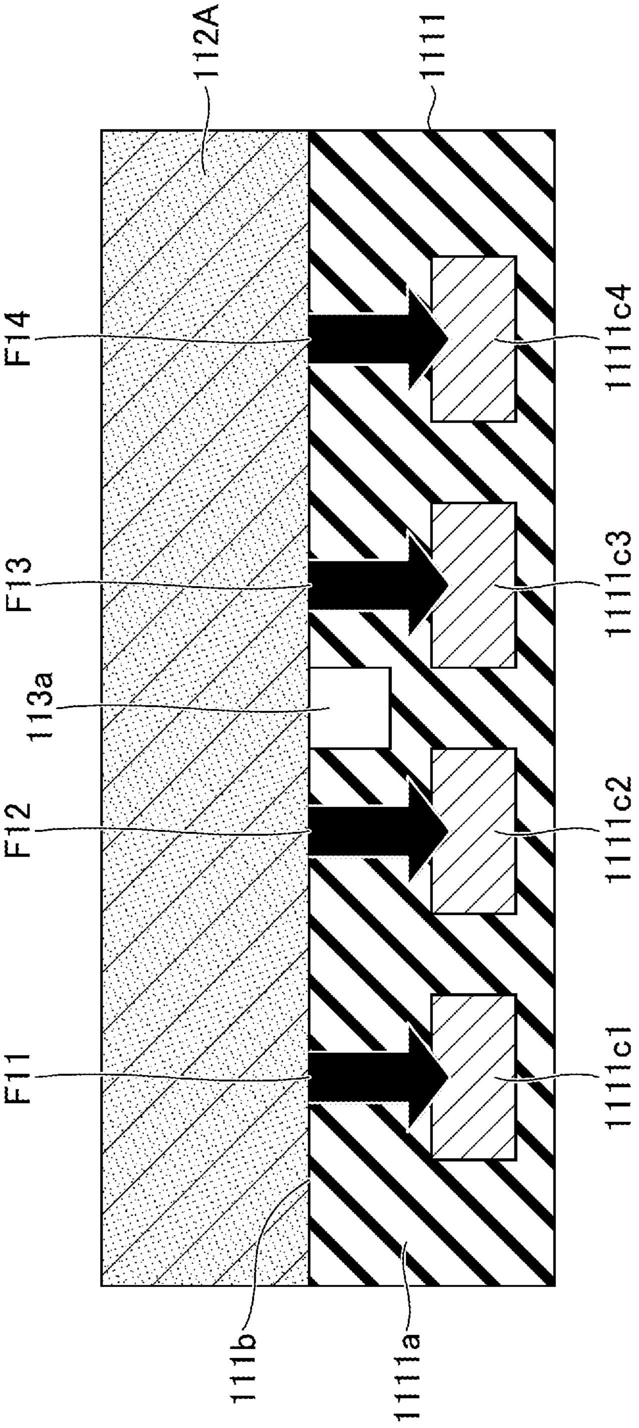
FIGS. 8A and SB are examples of a schematic view illustrating an attracting force.
Figure 8B:
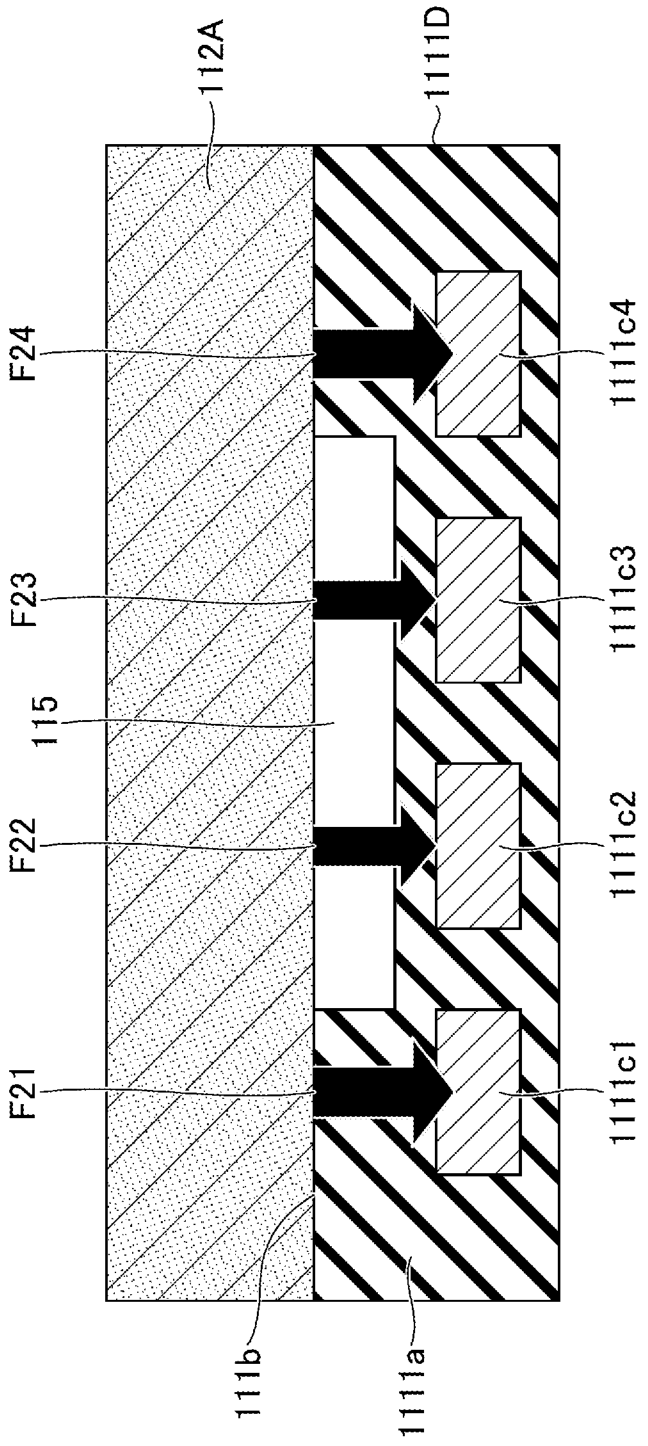

FIGS. 8A and SB are examples of a schematic view illustrating the attracting force. FIG. 8A is an example of a schematic view illustrating the attracting force in the electrostatic chuck 1111 including the diffusion groove 113. FIG. 8B is an example of a schematic view illustrating the attracting force in the electrostatic chuck 1111D according to the reference example including the diffusion groove 115. In FIGS. 8A and 8B, the magnitude of the attracting force F (F11 to F14 and F21 to F24) is schematically shown with the size of an arrow.

First, the electrostatic chuck 1111D according to the reference example will be described. As illustrated in FIG. 8B, the diffusion groove 115 is provided so as to overlap the annular electrostatic electrodes 1111*c*2 and 1111*c*3.

The diffusion groove 115 is filled with the heat transfer gas (e.g., He gas). Therefore, the attracting force F22 of the annular electrostatic electrode 1111*c*2 and the attracting force F23 of the annular electrostatic electrode 1111*c*3 are generated in accordance with the synthesis capacitance C of the heat transfer gas (e.g., He gas) in the diffusion groove 115, and the ceramic member 1111*a* between the diffusion groove 115 and the annular electrostatic electrodes 1111*c*2 and 1111*c*3.

Meanwhile, the attracting force F21 of the annular electrostatic electrode 1111*c*1 and the attracting force F24 of the annular electrostatic electrode 1111*c*4 are generated in accordance with the synthesis capacitance C of the ceramic member 1111*a* between the edge ring 112A and the annular electrostatic electrodes 1111*c*1 and 1111*c*4.

The relative dielectric constant of the heat transfer gas (e.g., He gas) is smaller than the relative dielectric constant of the ceramic member 1111*a* (e.g., alumina). Therefore, the synthesis capacitance C in the annular electrostatic electrodes 1111*c*2 and 1111*c*3 is smaller than the synthesis capacitance C in the annular electrostatic electrodes 1111*c*1 and 1111*c*4. Thus, the attracting forces F22 and F23 are smaller than the attracting forces F21 and F24. That is, the attracting force F is different between: the region where the annular electrostatic electrode 1111*c* and a diffusion groove 114 overlap each other; and the region where the annular electrostatic electrode 1111*c* and the diffusion groove 114 do not overlap each other. Therefore, the attracting force of the electrostatic chuck 1111 becomes non-uniform. The temperature control of the edge ring 112A may become unstable due to the non-uniformity of the attracting force. Also, the non-uniformity of the attracting force may cause slight vibration of the edge ring 112A.

Next, the electrostatic chuck 1111 according to the present embodiment will be described. As illustrated in FIG. 8A, the annular groove 113*a* of the diffusion groove 113 is provided so as not to overlap the annular electrostatic electrode 1111*c*. That is, the synthesis capacitance C is approximately the same in the annular electrostatic electrodes 1111*c*1 to 1111*c*4. Thereby, the attracting force F11 in the annular electrostatic electrode 1111*c*1, the attracting force F12 in the annular electrostatic electrode 1111*c*2, the attracting force F13 in the annular electrostatic electrode 1111*c*3, and the attracting force F14 in the annular electrostatic electrode 1111*c*4 can be made approximately the same. Thus, the in-plane uniformity of the attracting force of the electrostatic chuck 1111 is improved. Also, by improving the in-plane uniformity of the attracting force, the temperature control of the edge ring 112A can be made stable. Further, by improving the in-plane uniformity of the attracting force, the slight vibration of the edge ring 112A can be suppressed.

Figure 9A:
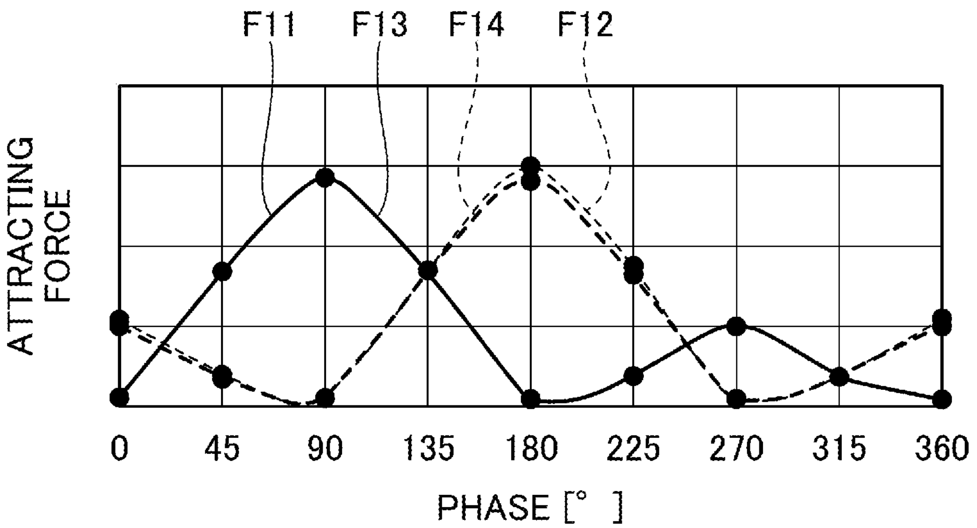
FIGS. 9A and 9B are graphs illustrating an example of the attracting force.
Figure 9B:
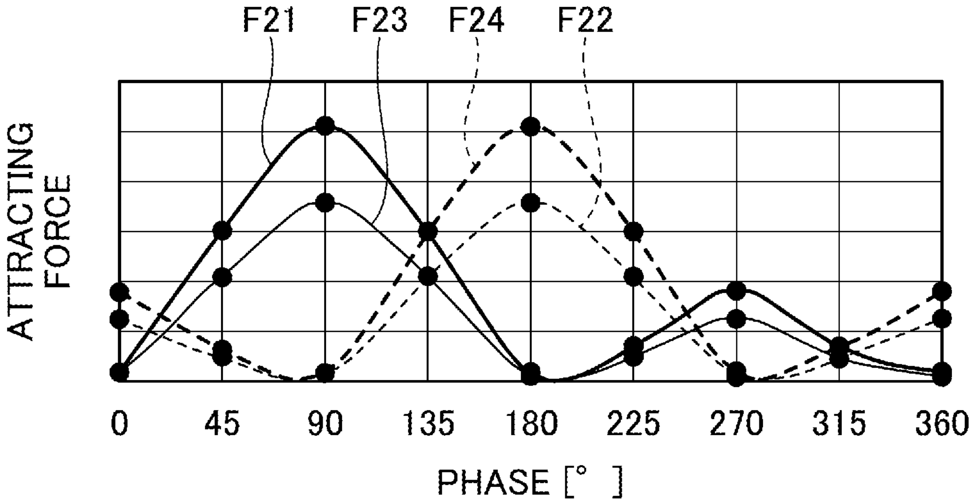

FIGS. 9A and 9B are graphs illustrating an example of the attracting force. FIG. 9A is an example of the graph showing the attracting force in the electrostatic chuck 1111 including the diffusion groove 113. FIG. 9B is an example of the graph showing the attracting force in the electrostatic chuck 1111D according to the reference example including the diffusion groove 115. The horizontal axis indicates a phase [°] of the voltage applied to the annular electrostatic electrode 1111*c*1. Here, a voltage having the same phase is applied to the annular electrostatic electrode 1111*c*1 and the annular electrostatic electrode 1111*c*3, and a voltage having a phase 90° different from the phase of the voltage applied to the annular electrostatic electrode 1111*c*1 is applied to the annular electrostatic electrodes 1111*c*2 and 1111*c*4. The vertical axis indicates the attracting force.

As shown in FIG. 9B, in the electrostatic chuck 1111D according to the reference example, a difference in the attracting force occurs between the attracting force F21 and the attracting force F23 in the annular electrostatic electrodes 1111*c*1 and 1111*c*3 to which the voltage having the same phase is applied. Also, a difference in the attracting force occurs between the attracting force F22 and the attracting force F24 in the annular electrostatic electrodes 1111*c*2 and 1111*c*4 to which the voltage having the same phase is applied. That is, the attracting force of the electrostatic chuck 1111 is non-uniform from position to position.

Meanwhile, as shown in FIG. 9A, in the electrostatic chuck 1111 according to the present embodiment, the attracting force is approximately the same between the attracting force F11 and the attracting force F13 in the annular electrostatic electrodes 1111*c*1 and 1111*c*3 to which the voltage having the same phase is applied. Also, the attracting force is approximately the same between the attracting force F12 and the attracting force F14 in the annular electrostatic electrodes 1111*c*2 and 1111*c*4 to which the voltage having the same phase is applied. That is, positional dependency of the attracting force of the electrostatic chuck 1111 is reduced.

As described above, according to the electrostatic chuck 1111 according to the present embodiment including the diffusion groove 113, the positional dependency of the attracting force is reduced, and the in-plane uniformity of the attracting force is improved. Also, by improving the in-plane uniformity of the attracting force, uniformity of cooling of the edge ring 112A is also improved.

The width of the annular groove 113*a* is preferably smaller than the interval between the annular electrostatic electrode 1111*c*2 and the annular electrostatic electrode 1111*c*3. In other words, the width of the annular groove 113*a* is preferably a width small enough to be within a range of from the outer diameter of the annular electrostatic electrode 1111*c*2 to the inner diameter of the annular electrostatic electrode 1111*c*3.

The length (longitudinal width) of the radial groove 113*b* is preferably a length small enough to be within a range of from the outer diameter of the annular electrostatic electrode 1111*c*1 to the inner diameter of the annular electrostatic electrode 1111*c*4. The amount of overlap between the annular electrostatic electrodes 1111*c*2 and 1111*c*3 and the diffusion groove 113 is determined in accordance with the width of the annular groove 113*a*, the length (longitudinal width) of the radial groove 113*b*, the number of the radial grooves 113*b*, and the width (transversal width) of the radial grooves 113*b*. The number of the radial grooves 113*b* and the width (transversal width) of the radial grooves 113*b* preferably have the following dimensions. Specifically, when the length (longitudinal width) of the radial grooves 113*b* and the width of the annular groove 113*a* are determined, the amount of overlap between the annular electrostatic electrode 1111*c*2 and the diffusion groove 113 is 24.5% or less the electrode area of the annular electrostatic electrode 1111*c*2, and the amount of overlap between the annular electrostatic electrode 1111*c*3 and the diffusion groove 113 is 45% or less the electrode area of the annular electrostatic electrode 1111*c*3.

The diffusion groove 113 as illustrated in FIGS. 1 to 5 includes the single annular groove 113*a*. However, this is by no means a limitation.

Figure 10:
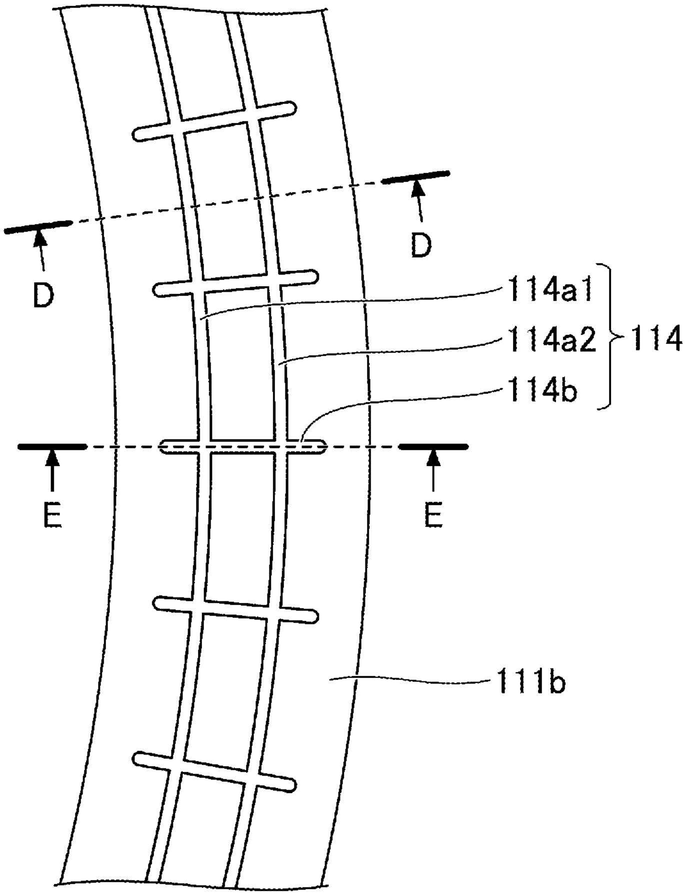
FIG. 10 is an example of a partially enlarged view of an annular region of an electrostatic chuck.
Figure 11:
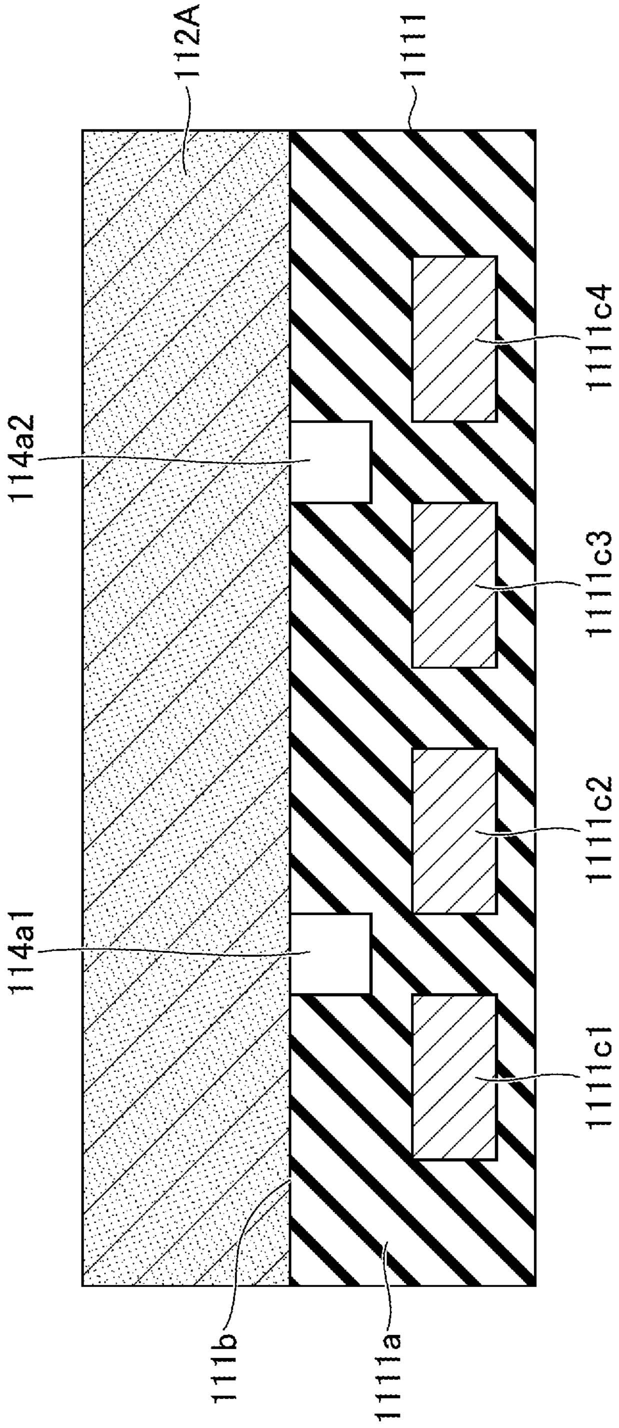
FIG. 11 is an example of a cross-sectional view of the electrostatic chuck and an edge ring that are cut along D-D.
Figure 12:
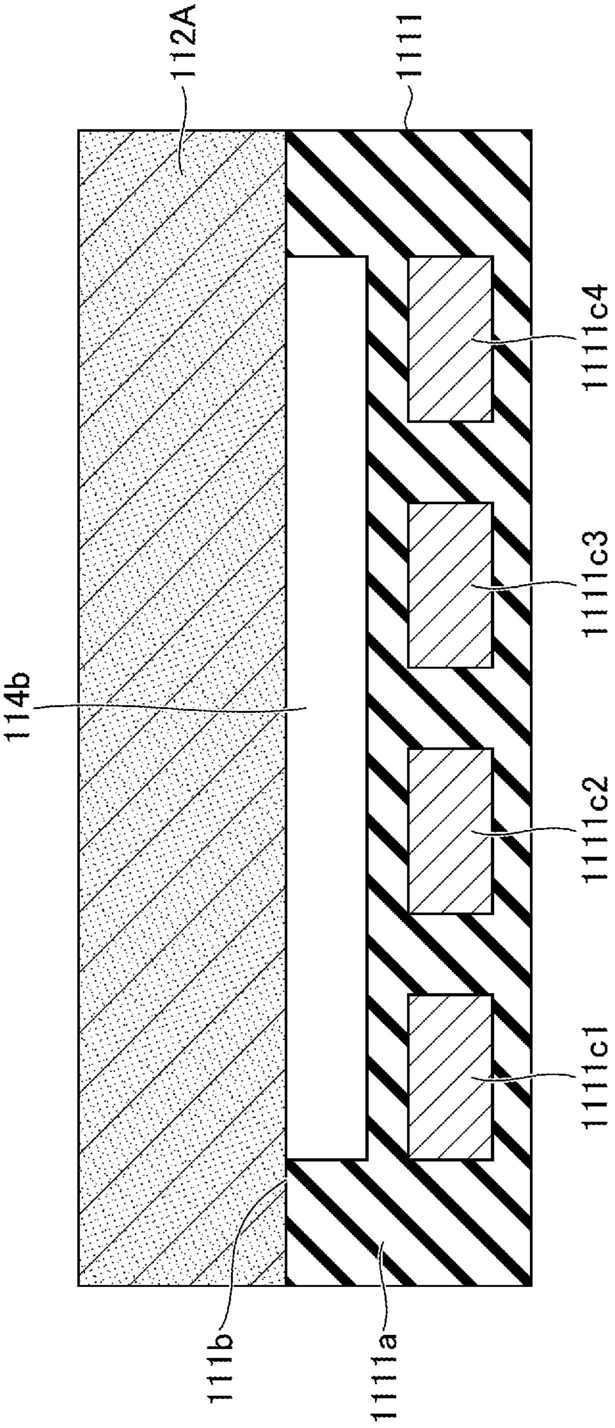
FIG. 12 is an example of a cross-sectional view of the electrostatic chuck and the edge ring that are cut along E-E.

FIG. 10 is an example of a partially enlarged view of the annular region 111*b* of the electrostatic chuck 1111. The partially enlarged view as illustrated in FIG. 10 is a view of the electrostatic chuck 1111 as seen from above. FIG. 11 is an example of a cross-sectional view of the electrostatic chuck 1111 and the edge ring 112A that are cut along D-D. FIG. 12 is an example of a cross-sectional view of the electrostatic chuck 1111 and the edge ring 112A that are cut along E-E.

The ring support surface (annular region 111*b*) of the electrostatic chuck 1111 supporting the edge ring 112A is provided with the diffusion groove 114. The diffusion groove 114 is a groove through which the heat transfer gas (also called a rear surface gas) supplied from the supply hole 54 is diffused in the circumferential and radial directions of the ring support surface.

The diffusion groove 114 includes an annular groove 114*al*, an annular groove 114*a*2, and multiple radial grooves 114*b*.

The annular grooves 114*a*1 and 114*a*2 are annular grooves that are provided at the ring support surface (annular region 111*b*) of the electrostatic chuck 1111, and are concentric with the center of the electrostatic chuck 1111. Although not illustrated, the supply hole 54 is in communication with the annular groove 114*al* or 114*a*2.

The radial groove 114*b* is a groove that is provided at the ring support surface (annular region 111*b*) of the electrostatic chuck 1111, is in communication with the annular grooves 114*al* and 114*a*2, and extends from the annular grooves 114*a*1 and 114*a*2 in the radial direction of the electrostatic chuck 1111. That is, the radial groove 114*b* communicates the annular grooves 114*a*1 and 114*a*2 with each other. As illustrated in FIG. 10, the radial groove 114*b* is formed as a groove that extends from the annular grooves 114*al* and 114*a*2 outward and inward in the radial direction. That is, one end of the radial groove 114*b* is provided inward of the annular groove 114*al* in the radial direction, the annular groove 114*al* being the closest to the inner circumference of the electrostatic chuck 1111, of the annular grooves 114*al* and 114*a*2. The other end of the radial groove 114*b* is provided outward of the annular groove 114*a*2 in the radial direction, the annular groove 114*a*2 being the closest to the outer circumference of the electrostatic chuck 1111, of the annular grooves 114*al* and 114*a*2.

The radial groove 114*b* is not limited to the groove as illustrated in FIG. 10, and may be formed as a groove that extends outward of, inward of, or both outward and inward of the annular grooves 114*al* and 114*a*2 in the radial direction. Also, the radial groove 114*b* may be formed as a groove that extends from the annular grooves 114*a*1 and 114*a*2 so as to be closer to the outer or inner circumference of the electrostatic chuck 1111, or so as to be closer to the outer and inner circumferences of the electrostatic chuck 1111. Also, the radial groove 114*b* is described as a groove formed by disposing the following grooves in the form of a straight line: a groove that extends from the annular groove 114*al* inward in the radial direction; a groove that communicates the annular groove 114*al* with the annular groove 114*a*2; and a groove that extends from the annular groove 114*a*2 outward in the radial direction. However, this is by no means a limitation. These grooves may be provided separately from each other.

In this manner, the heat transfer gas supplied from the supply hole 54 is diffused through the annular grooves 114*al* and 114*a*2 in the circumferential direction of the ring support surface. Further, the heat transfer gas is diffused through the radial groove 114*b* in the radial direction of the ring support surface. That is, the heat transfer gas is diffused over the entirety of the ring support surface.

In a plan view of the ring support surface, the annular grooves 114*a*1 and 114*a*2 are provided at positions not overlapping the annular electrostatic electrode 1111*c* (1111*c*1 to 1111*c*4). In the example as illustrated in FIG. 11, the annular groove 114*al* is provided on the outer circumferential side of the annular electrostatic electrode 1111*c*1 and on the inner circumferential side of the annular electrostatic electrode 1111*c*2. That is, in the radial direction, a side surface of the annular groove 114*al* on the inner circumferential side thereof is provided to coincide with or to be outward of an end surface of the annular electrostatic electrode 1111*c*1 on the outer circumferential side thereof. Also, in the radial direction, a side surface of the annular groove 114*al* on the outer circumferential side thereof is provided to coincide with or to be inward of an end surface of the annular electrostatic electrode 1111*c*2 on the inner circumferential side thereof. Meanwhile, the annular groove 114*a*2 is provided on the outer circumferential side of the annular electrostatic electrode 1111*c*3 and on the inner circumferential side of the annular electrostatic electrode 1111*c*4. That is, in the radial direction, a side surface of the annular groove 114*a*2 on the inner circumferential side thereof is provided to coincide with or to be outward of an end surface of the annular electrostatic electrode 1111*c*3 on the outer circumferential side thereof. Also, in the radial direction, a side surface of the annular groove 114*a*2 on the outer circumferential side thereof is provided to coincide with or to be inward of an end surface of the annular electrostatic electrode 1111*c*4 on the inner circumferential side thereof.

In FIG. 11, the annular grooves 114*al* and 114*a*2 and the annular electrostatic electrode 1111*c* (1111*c*1 to 1111*c*4) are provided at positions not overlapping each other. However, this is by no means a limitation. The annular grooves 114*a*1 and 114*a*2 and the annular electrostatic electrode 1111*c* (1111*c*1 to 1111*c*4) may partially overlap each other.

In a plan view of the ring support surface, the radial groove 114*b* is provided at a position that partially overlaps the annular electrostatic electrode 1111*c* (1111*cl* to 1111*c*4). In the example as illustrated in FIG. 12, the radial groove 114*b* is provided so as to overlap the annular electrostatic electrodes 1111*c*1 to 1111*c*4.

Also, the number of the annular grooves included in the diffusion groove is not limited to this, but may be three or more. For example, the diffusion groove may include an annular groove provided between the annular electrostatic electrode 1111*c*1 and the annular electrostatic electrode 1111*c*2, an annular groove provided between the annular electrostatic electrode 1111*c*2 and the annular electrostatic electrode 1111*c*3, and an annular groove provided between the annular electrostatic electrode 1111*c*3 and the annular electrostatic electrode 1111*c*4. Also, the diffusion groove may include an annular groove at a position that is on the inner circumferential side of the annular electrostatic electrode 1111$c$1 and is closer to the annular electrostatic electrode 1111$c$1. Also, the diffusion groove may include an annular groove at a position that is on the outer circumferential side of the annular electrostatic electrode 1111$c$4 and is closer to the annular electrostatic electrode 1111$c$4. The radial groove is provided so as to communicate these annular electrostatic electrodes.

The annular electrostatic electrode 1111$c$ is described as being provided in the form of multiple rings. However, this is by no means a limitation. The annular electrostatic electrode 1111$c$ may be formed by helically winding two electrodes. In this case, the diffusion groove may include: a helical groove formed between the two electrodes; and multiple radial grooves, in a plan view.

The diffusion grooves 113 and 114 formed at the ring support surface (annular region 111$b$) supporting the edge ring 112A have been described as an example. However, this is by no means a limitation. These are similarly applicable as diffusion grooves in the substrate support surface (annular region 111$b$) supporting the substrate W. That is, the diffusion grooves provided at the substrate support surface (annular region 111$b$) may include: one or more annular grooves provided so as not to overlap the electrostatic electrode 1111$b$; and multiple radial grooves communicating with the annular grooves, in a plan view.

The embodiments as disclosed above include, for example, the following.

(Clause 1)

A substrate-processing apparatus, including:

a substrate support that includes an electrostatic chuck, the electrostatic chuck including a support surface configured to support an annular member, in which the support surface includes a diffusion groove through which a heat transfer gas is diffused into a gap between the annular member and the support surface, and the diffusion groove includes an annular groove provided concentrically with the electrostatic chuck; and a radial groove that is in communication with the annular groove and is provided from the annular groove in a radial direction of the electrostatic chuck.

(Clause 2)

The substrate-processing apparatus as described in clause 1, in which the diffusion groove includes multiple annular grooves that are each the annular groove, and the radial groove is in communication with the multiple annular grooves.

(Clause 3)

The substrate-processing apparatus as described in clause 1, in which one end of the radial groove is provided inward of the annular groove in the radial direction, and another end of the radial groove is provided outward of the annular groove in the radial direction.

(Clause 4)

The substrate-processing apparatus as described in clause 2, in which one end of the radial groove is provided inward, in the radial direction, of the annular groove that is closest to an inner circumference of the electrostatic chuck, of the multiple annular grooves, and another end of the radial groove is provided outward, in the radial direction, of the annular groove that is closest to an outer circumference of the electrostatic chuck, of the multiple annular grooves.

(Clause 5)

The substrate-processing apparatus as described in any one of clauses 1 to 4, in which the electrostatic chuck includes multiple electrodes configured to electrostatically attract the annular member, and in a plan view of the support surface, the annular groove is provided at a position not overlapping the electrodes, and at least a part of the radial groove is provided at a position overlapping at least one of the electrodes.

(Clause 6)

The substrate-processing apparatus as described in clause 5, further including:

a power supply configured to apply an alternating current voltage to the electrodes.

(Clause 7)

The substrate-processing apparatus as described in clause 5, further including:

a power supply configured to apply a direct current voltage to the electrodes.

(Clause 8)

The substrate-processing apparatus as described in any one of clauses 5 to 7, in which the multiple electrodes form a concentric annular shape.

According to one aspect, it is possible to provide a substrate-processing apparatus configured to improve in-plane uniformity of an attracting force to electrostatically attract an annular member.

It should be noted that the present invention is not limited to the configurations of the embodiments as described above. Combination thereof with other elements and the like are possible. Any changes are possible without departing from the scope of claims recited, and can be appropriately determined in accordance with application forms thereof.

What is claimed is:

1. A substrate-processing apparatus, comprising:

a substrate support that includes an electrostatic chuck, the electrostatic chuck including a support surface configured to support an annular member, wherein the support surface includes a diffusion groove through which a heat transfer gas is diffused into a gap between the annular member and the support surface, and the diffusion groove includes an annular groove provided concentrically with the electrostatic chuck, and a radial groove that is in communication with the annular groove and is provided from the annular groove in a radial direction of the electrostatic chuck, wherein the electrostatic chuck includes multiple electrodes configured to electrostatically attract the annular member, and in a plan view of the support surface, the annular groove is provided at a position not overlapping the electrodes, and at least a part of the radial groove is provided at a position overlapping the electrodes.

2. The substrate-processing apparatus according to claim 1, wherein the diffusion groove includes multiple annular grooves that are each the annular groove, and the radial groove is in communication with the multiple annular grooves.

3. The substrate-processing apparatus according to claim 1, wherein one end of the radial groove is provided inward of the annular groove in the radial direction, and another end of the radial groove is provided outward of the annular groove in the radial direction.

4. The substrate-processing apparatus according to claim 2, wherein one end of the radial groove is provided inward, in the radial direction, of the annular groove that is closest to an inner circumference of the electrostatic chuck, of the multiple annular grooves, and another end of the radial groove is provided outward, in the radial direction, of the annular groove that is closest to an outer circumference of the electrostatic chuck, of the multiple annular grooves.

5. The substrate-processing apparatus according to claim 1, further comprising:

a power supply configured to apply an alternating current voltage to the electrodes.

6. The substrate-processing apparatus according to claim 1, further comprising:

a power supply configured to apply a direct current voltage to the electrodes.

7. The substrate-processing apparatus according to claim 1, wherein the multiple electrodes form a concentric annular shape.

* * * * *